United States Patent
Yoon et al.

(10) Patent No.: US 12,278,557 B2
(45) Date of Patent: Apr. 15, 2025

(54) POWER CONVERSION DEVICE AND CONTROL METHOD THEREOF

(71) Applicant: LS ELECTRIC CO., LTD., Anyang-si (KR)

(72) Inventors: Sun Jae Yoon, Anyang-si (KR); Ki Woo Park, Anyang-si (KR); Jung Won Seo, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 264 days.

(21) Appl. No.: 18/014,298

(22) PCT Filed: Jun. 30, 2021

(86) PCT No.: PCT/KR2021/008277
§ 371 (c)(1),
(2) Date: Jan. 3, 2023

(87) PCT Pub. No.: WO2022/005206
PCT Pub. Date: Jan. 6, 2022

(65) Prior Publication Data
US 2023/0261562 A1     Aug. 17, 2023

(30) Foreign Application Priority Data

Jul. 3, 2020 (KR) .................... 10-2020-0082213
Aug. 18, 2020 (KR) .................... 10-2020-0103474

(51) Int. Cl.
*H02M 7/487*    (2007.01)
*H02M 1/08*    (2006.01)
(Continued)

(52) U.S. Cl.
CPC .............. *H02M 1/32* (2013.01); *H02M 1/08* (2013.01); *H02M 1/36* (2013.01); *H02M 7/487* (2013.01);
(Continued)

(58) Field of Classification Search
CPC ...... H02M 7/48; H02M 7/4803; H02M 7/483; H02M 7/487; H02M 7/53; H02M 7/539;
(Continued)

(56) References Cited

U.S. PATENT DOCUMENTS 8,472,153 B1 * 6/2013 Grbovic ............... H02H 7/1216
361/101
9,225,262 B2 * 12/2015 Aaltio ................... H02M 7/487
(Continued)

FOREIGN PATENT DOCUMENTS

CN      100566108 C  * 12/2009
CN      101515763 B    11/2010
(Continued)

OTHER PUBLICATIONS

Office Action for related Japanese Application No. 2023-500101; action dated Dec. 19, 2023; (16 pages).
(Continued)

*Primary Examiner* — Thienvu V Tran
*Assistant Examiner* — Shahzeb K Ahmad
(74) *Attorney, Agent, or Firm* — K&L Gates LLP

(57) ABSTRACT

The present disclosure relates to a power conversion device and a control method thereof and, more specifically, to a power conversion device which may protect a switching element when performing stopping of driving, and a control method thereof. A power conversion device according to an embodiment of the present disclosure comprises a pulse width modulation (PWM) controller for outputting, to a gate driver, a first pulse width modulation signal for controlling a first switching element, a second pulse width modulation signal for controlling a second switching element, a third pulse width modulation signal for controlling a third switching element, and a fourth pulse width modulation signal for controlling a fourth switching element.

16 Claims, 11 Drawing Sheets

(51) Int. Cl.
  *H02M 1/32* (2007.01)
  *H02M 1/36* (2007.01)
  *H02M 7/5395* (2006.01)
  *H03K 17/0812* (2006.01)
  *H03K 17/284* (2006.01)

(52) U.S. Cl.
  CPC .... *H02M 7/5395* (2013.01); *H03K 17/08122* (2013.01); *H03K 17/284* (2013.01)

(58) Field of Classification Search
  CPC ........ H02M 7/5395; H02M 1/08; H02M 1/32; H02M 1/36; H03K 17/08122; H03K 17/284
  See application file for complete search history.

(56) References Cited

U.S. PATENT DOCUMENTS

| 10,541,624 | B2 | 1/2020 | Ishino et al. | |
| 2007/0159749 | A1* | 7/2007 | Oka | H02M 7/487 361/93.1 |
| 2011/0013438 | A1 | 1/2011 | Frisch et al. | |
| 2014/0204636 | A1* | 7/2014 | Liu | H02H 7/122 363/55 |
| 2019/0267912 | A1 | 8/2019 | Ishino et al. | |
| 2021/0367530 | A1* | 11/2021 | Du | H02M 7/487 |
| 2021/0376753 | A1* | 12/2021 | Liu | H02M 7/2173 |

FOREIGN PATENT DOCUMENTS

| JP | 2000341962 A | | 12/2000 | |
| JP | 2002078351 A | | 3/2002 | |
| JP | 2019149882 A | | 9/2019 | |
| JP | 2019213169 A | * | 12/2019 | |
| KR | 20170077339 A | | 7/2017 | |
| WO | WO-2012046521 A1 | * | 4/2012 | ............ H02M 7/487 |

OTHER PUBLICATIONS

International Search Report for related International Application No. PCT/KR2021/008277; report dated Jan. 6, 2022; (7 pages).
Written Opinion for related International Application No. PCT/KR2021/008277; report dated Jan. 6, 2022; (10 pages).
Fang, et al.; "The Research on Protection of Over-voltage about NPC Three-level Medium Voltage Motor Drives"; Oct. 17, 2008; International Conference on Electrical Machines and Systems; (6 pages).
Mohammed Hassan Ahmed, et al.; "Power Loss Model and Efficiency Analysis of Three-Phase Inverter Based on SiC MOSFETs for PV Applications"; Jun. 13, 2019; IEE Access; (15 pages).
Kim, et al.; "Detection Method for Open-Circuit Fault in Neutral-Point-Clamped Inverter Systems"; IEEE Transactions on Industrial Electronics, vol. 56, No. 7, Jul. 2009; (11 pages).
Madhusoodhanan, et al.; "Comparison study of 12kV n-type SiC IGBT with 10kV SiC MOSFET and 6.5kV Si IGBT based on 3L-NPC VSC applications"; 2012; IEEE; (9 pages).

* cited by examiner

POWER CONVERSION DEVICE AND CONTROL METHOD THEREOF

CROSS-REFERENCE TO RELATED APPLICATIONS

This application is the National Stage filing under 35 U.S.C. 371 of International Application No. PCT/KR2021/008277, filed on Jun. 30, 2021, which claims the benefit of earlier filing date and right of priority to Korea utility model Application No. 10-2020-0082213 filed on Jul. 3, 2020, and Korea utility model Application No. 10-2020-0103474, filed on Aug. 18, 2020, the contents of which are all hereby incorporated by reference herein in their entirety.

FIELD

The present disclosure relates to a power conversion device and a method for controlling the same. More specifically, the present disclosure relates to a power conversion device capable of protecting a switching element when an operation is stopped and a method for controlling the same.

BACKGROUND

In a conventional power conversion device, when an operation is stopped, control signals for simultaneously turning off switching elements are simultaneously output.

In this case, not all switching elements are turned off at the same time due to signal transfer delay, but some switching elements are turned off earlier or turned off later.

When some switching elements are turned off earlier or turned off later, a high voltage is momentarily applied to a specific switching element, thereby causing damage to the specific switching element.

Therefore, a need for a control method for protecting a switching element when an operation is stopped in a power conversion device is increasing.

In addition, in a conventional power conversion device, a Schottky diode is additionally connected to prevent loss reduction due to a high voltage drop when the diode is conductive. However, there is a problem of cost increase due to the addition of the diode. A current sensor is required to measure current. Further, complexity increases due to passive turn-on/turn-off control by current flow.

Further, a conventional power conversion device includes a 3-level inverter/converter system in which a switching element and a passive element connected in parallel with the switching element are made of different materials and each element is separately connected. However, parasitic inductance is very large, and thus an additional gating circuit is used. Thus, a configuration thereof is very complicated.

Further, in a conventional power conversion device, the switching elements and the diode constitute a plurality of modules, thereby increasing parasitic inductance.

SUMMARY

A purpose of the present disclosure is to provide a power conversion device that minimizes possibility of damage to a switching element that may occur when an operation is stopped in the power conversion device.

A purpose of the present disclosure is to provide a power conversion device in which when an operation is stopped in the power conversion device, a signal input to a specific switching element is delayed by a predefined delay time, thereby preventing damage to the specific switching element.

A purpose of the present disclosure is to provide a power conversion device in which when an operation is stopped in the power conversion device, an instantaneous high voltage is prevented from being applied to a switching element, thereby minimizing possibility of damage thereto.

A purpose of the present disclosure is to provide a high-efficiency power conversion device that can reduce conduction loss without using an additional diode.

A purpose of the present disclosure is to provide a power conversion device in which a plurality of switching elements and diodes are packaged into one module, thereby reducing inductance and thus increasing power conversion efficiency.

A purpose of the present disclosure is to provide a power conversion device which controls an operation of each of switching elements according to a voltage mode of a voltage output from a power source, thereby reducing a time for which a diode is conductive.

A power conversion device according to an embodiment of the present disclosure includes a leg including: a first switching element, a second switching element, a third switching element, a fourth switching element connected in series with each other; a first diode, a second diode, a third diode, and a fourth diode respectively connected in anti-parallel to the first switching element, the second switching element, the third switching element, and the fourth switching element; and a fifth diode and a sixth diode connected in series with each other, wherein the fifth diode and the sixth diode are disposed between and respectively connected to a connection point between the first switching element and the second switching element and a connection point between the third switching element and the fourth switching element; a smoothing unit including: an DC positive terminal connected to a drain terminal of the first switching element; a DC negative terminal connected to a source terminal of the fourth switching element; and a first capacitor and a second capacitor disposed between and respectively connected to the DC positive terminal and the DC negative terminal, wherein the first capacitor and the second capacitor are connected in series to each other at a neutral point; an AC terminal connected to a connection point between the second switching element and the third switching element; a gate driver configured to control an on or off state of each of the first switching element, the second switching element, the third switching element and the fourth switching element, based on a potential output from each of the DC positive terminal, the DC negative terminal, and the neutral point; a pulse width modulation (PWM) controller configured to output, to the gate driver, a plurality of pulse width modulation signals for respectively controlling a plurality of switching elements, and a signal delay unit configured to delay at least one pulse width modulation signal among the plurality of pulse width modulation signals by a predefined delay time.

The power conversion device according to an embodiment of the present disclosure includes the pulse width modulation (PWM) controller configured to output, to the gate driver: a first pulse width modulation signal for controlling the first switching element; a second pulse width modulation signal for controlling the second switching element; a third pulse width modulation signal for controlling the third switching element; and a fourth pulse width modulation signal for controlling the fourth switching element.

The power conversion device according to an embodiment of the present disclosure includes the signal delay unit configured to delay the second pulse width modulation signal or the third pulse width modulation signal by the predefined delay time.

The power conversion device according to an embodiment of the present disclosure includes the signal delay unit configured to delay the second pulse width modulation signal output from the PWM controller by the predefined delay time to output a delayed second pulse width modulation signal.

In the power conversion device according to an embodiment of the present disclosure, when an operation of the power conversion device is stopped while current flows along a path from the first switching element to the second switching element, the gate driver is configured to turn off the second switching element later by the predefined delay time than a time at which the first switching element is turned off.

The power conversion device according to an embodiment of the present disclosure includes the signal delay unit configured to delay the third pulse width modulation signal output from the PWM controller by the predefined delay time to output a delayed third pulse width modulation signal.

In the power conversion device according to an embodiment of the present disclosure, when an operation of the power conversion device is stopped while current flows along a path from the third switching element to the fourth switching element, the gate driver is configured to turn off the third switching element later by the predefined delay time than a time at which the fourth switching element is turned off.

In the power conversion device according to an embodiment of the present disclosure, the gate driver is configured such that a timing at which each of the plurality of switching elements is turned off varies based on an on or off state of each of the plurality of switching elements.

In the power conversion device according to an embodiment of the present disclosure, when the first switching element and the second switching element are turned on and an operation stop command of the power conversion device is executed, the gate driver is configured to turn off the second switching element later by a predefined delay time than a time at which the first switching element is turned off.

In the power conversion device according to an embodiment of the present disclosure, when the third switching element and the fourth switching element are turned on and an operation stop command of the power conversion device is executed, the gate driver is configured to turn off the third switching element later by the predefined delay time than a time at which the fourth switching element is turned off.

A power conversion device according to an embodiment of the present disclosure includes a leg including: a first switching element, a second switching element, a third switching element, a fourth switching element connected in series with each other; a first diode, a second diode, a third diode, and a fourth diode respectively connected in anti-parallel to the first switching element, the second switching element, the third switching element, and the fourth switching element; and a fifth diode and a sixth diode connected in series with each other, wherein the fifth diode and the sixth diode are disposed between and respectively connected to a connection point between the first switching element and the second switching element and a connection point between the third switching element and the fourth switching element; a smoothing unit including: an DC positive terminal connected to a drain terminal of the first switching element; a DC negative terminal connected to a source terminal of the fourth switching element; and a first capacitor and a second capacitor disposed between and respectively connected to the DC positive terminal and the DC negative terminal, wherein the first capacitor and the second capacitor are connected in series to each other at a neutral point; an AC terminal connected to a connection point between the second switching element and the third switching element; and a gate driver configured to control an on or off state of each of the first switching element, the second switching element, the third switching element and the fourth switching element, based on a potential output from each of the DC positive terminal, the DC negative terminal, and the neutral point.

In the power conversion device according to an embodiment of the present disclosure, when a potential from the DC positive terminal is output, the gate driver is configured to turn on the first switching element and the second switching element, and to turn off the third switching element and the fourth switching element.

In the power conversion device according to an embodiment of the present disclosure, when a potential from the neutral point is output, and an AC voltage is a positive (+) voltage, the gate driver is configured to turn off the first switching element and to turn on the second switching element.

In the power conversion device according to an embodiment of the present disclosure, when a potential from the neutral point is output and an AC voltage is a negative (−) voltage, the gate driver is configured to turn off the fourth switching element and to turn on the third switching element.

In the power conversion device according to an embodiment of the present disclosure, when a potential from the DC negative terminal is output, the gate driver is configured to turn on the third switching element and the fourth switching element, and to turn off the first switching element and the second switching element.

In the power conversion device according to an embodiment of the present disclosure, when the second switching element and the third switching element are in a turned-on state, the gate driver is configured to maintain an off state of the first switching element.

In the power conversion device according to an embodiment of the present disclosure, when the second switching element and the third switching element 13 are in a turned-on state, the gate driver is configured to maintain an off state of the fourth switching element.

In the power conversion device according to an embodiment of the present disclosure, the leg includes a plural of legs, and the plurality of legs are connected in parallel to each other.

In the power conversion device according to an embodiment of the present disclosure, a cathode terminal of the fifth diode is connected to and disposed between the first switching element and the second switching element, wherein the fifth diode is configured to prevent current flow from the connection point between the first switching element and the second switching element to the neutral point.

In the power conversion device according to an embodiment of the present disclosure, an anode terminal of the sixth diode is connected to and disposed between the third switching element and the third switching element, wherein the sixth diode is configured to prevent current flow from the neutral point to the connection point between the third switching element and the fourth switching element.

According to an embodiment of the present disclosure, the power conversion device may minimize possibility of damage to a switching element that may occur when an operation is stopped.

According to one embodiment of the present disclosure, when an operation is stopped in the power conversion device, the power conversion device may delay a signal input to a specific switching element by a predefined delay time such that damage to the specific switching element may be prevented.

According to one embodiment of the present disclosure, when an operation is stopped in the power conversion device, the power conversion device may prevent a high voltage from being momentarily applied to a switching element, thereby minimizing possibility of damage thereto.

According to an embodiment of the present disclosure, conduction loss may be reduced without using an additional diode.

According to one embodiment of the present disclosure, efficiency of power conversion of the power conversion device may be increased by reducing the parasitic inductance due to a plurality of switching elements and diodes of the power conversion device.

According to one embodiment of the present disclosure, the efficiency of power conversion of the power conversion device may be increased by controlling the operation of each of the switching elements according to a voltage mode of a voltage output from a power source so as to reduce a conduction time for which a diode is conductive.

DETAILED DESCRIPTION

Hereinafter, embodiments related to the present disclosure will be described in more detail with reference to drawings. The suffixes "module" and "unit" for the components used in following descriptions are given or used interchangeably in consideration of ease of writing the present disclosure, and do not have meanings or roles that are distinct from each other by themselves.

Figure 1:
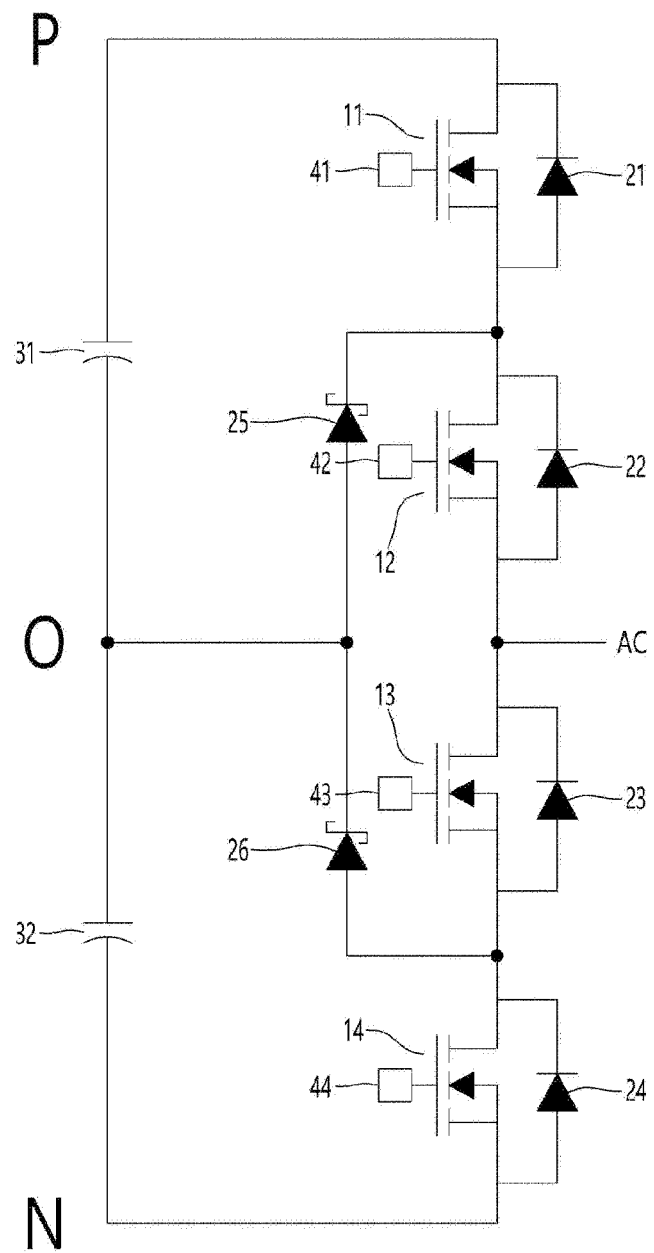
FIG. 1 is a diagram showing an example of a configuration of a power conversion device according to one embodiment of the present disclosure.

FIG. 1 is a diagram showing an example of a configuration of a power conversion device according to one embodiment of the present disclosure.

Referring to FIG. 1, a single-phase circuit of a power conversion device 1 according to one embodiment of the present disclosure is shown. When the power conversion device 1 is an inverter device that supplies power in 3-phases, the circuit in FIG. 1 may be configured as a 3-phases circuit to convert DC power source into AC power source and output the AC power. Further, when the power conversion device 10 is a converter device that supplies power source in 3-phases, the circuit in FIG. 1 may be configured as a 3-phases circuit to convert AC power source into DC power source and output DC power.

Referring to FIG. 1, the power conversion device 1 may include a leg including a first switching element 11, a second switching element 12, a third switching element 13, a fourth switching element 14, a first diode 21, a second diode 22, a third diode 23, a fourth diode 24, a fifth diode 25, and a sixth diode 26. Further, the power conversion device 1 may include a first capacitor 31, a second capacitor 32, an AC terminal AC, a DC positive (+) terminal P, and a DC negative (−) terminal N. The first capacitor 31 and the second capacitor 32 may be serially connected to each other and may be disposed between and respectively connected to the DC positive (+) terminal P and the DC negative (−) terminal N. Therefore, a DC link may be connected in series with the two capacitors. Further, the power conversion device 1 may include a smoothing unit including the DC positive terminal connected to a drain terminal of the first switching element, the DC negative terminal connected to a source terminal of the fourth switching element, and the first capacitor and the second capacitor connected in series to each other at a neutral point disposed between and respectively connected to the DC positive and negative terminals.

In one example, each of the first diode 21, the second diode 22, the third diode 23 and the fourth diode 24 may be a body diode of each of the first switching element 11, the second switching element 12, the third switching element and the fourth switching element 14. Further, a combination of the first switching element 11 and the first diode 21 may be referred to as a first power semiconductor switch, a combination of the second switching element 12 and the second diode 22 may be referred to as a second power semiconductor switch, a combination of the third switching element 13 and the second diode 23 may be referred to as a third power semiconductor switch, and a combination of the fourth switching element 14 and the fourth diode 21 may be referred to as a fourth power semiconductor switch. The power semiconductor switch may include a MOSFET, a SiC MOSFET, an insulated gate bipolar transistor (IGBT), and the like.

Further, the power conversion device 1 may include a gate driver 40. The gate driver 40 may control the switching elements. The gate driver 40 may include a first gate driver 41, a second gate driver 42, a third gate driver 43, and a fourth gate driver 44. The gate driver 40 may apply or block a voltage to each of the switching elements 11, 12, 13, and 14 to turn on or off each of the switching elements.

The first switching element 11, the second switching element 12, the third switching element 13, and the fourth switching element 14 may be connected in series to each other while the first switching element 11 may be connected to the positive (+) terminal of the DC power source and the fourth switching element 14 may be connected to the negative (−) terminal thereof.

Further, the fifth diode 25 and the sixth diode 26 may be connected in series with each other, and a connection point between the fifth diode 25 and the sixth diode 26 may be connected at a neutral point O between the first capacitor 31 and the second capacitor 32.

In one example, each of the fifth diode 25 and the sixth diode 26 may be embodied as a Zener diode. The Zener diode is a type of a semiconductor diode, and has a very low breakdown voltage characteristic, so that current flows therein when a predefined breakdown voltage in a reverse direction is applied thereto. Therefore, the fifth diode 25 and the sixth diode 26 may protect circuit elements from overvoltage.

In one example, a cathode terminal of the fifth diode 25 may be connected to and disposed between the first switching element 11 and the second switching element 12. The fifth diode 25 may be configured to prevent current flow from a connection point between the first switching element 11 and the second switching element 12 to the neutral point O of the DC power source.

Further, an anode terminal of the sixth diode 26 may be connected to and disposed between the third switching element 13 and the fourth switching element 14. The sixth diode 26 may be configured to prevent current flow from the neutral point O of the DC power source to a connection point between the third switching element 13 and the fourth switching element 14.

In one example, each of the first switching element 11, the second switching element 12, the third switching element 13 and the fourth switching element 14, the first diode 21, the second diode 22, the third diode 23, and the fourth diode 24 respectively connected in anti-parallel to the first switching element 11, the second switching element 12, the third switching element 13 and the fourth switching element 14, and the fifth diode 25, and the sixth diode 26 may be a wide band gap (WBG) semiconductor element having a band gap equal to or greater than a predefined band gap $E_g$. The wide band gap semiconductor element may be an element made of a material such as silicon carbide (SiC), gallium nitride (GaN), gallium oxide ($Ga_2O_3$), aluminum nitride (AlN), or diamond, etc.

Therefore, the power conversion device 1 may minimize conduction loss without connecting an additional diode, for example a Schottky diode to prevent loss reduction due to high voltage drop when each of the first diode 21, the second diode 22, the third diode 23, and the fourth diode 24 respectively connected in anti-parallel to the first switching element 11, the second switching element 12, the third switching element 13, and the fourth switching element 14 is conductive.

The power conversion device 1 does not require a current sensor to measure current flowing in the additional diode, so that a cost thereof may be lowered. A complexity thereof may be reduced because the power conversion device 1 does not control on-off according to current conduction.

Further, parasitic inductance may be reduced because the switching elements and the diodes as the wide band gap semiconductor elements may be packaged into one module.

Figure 2:
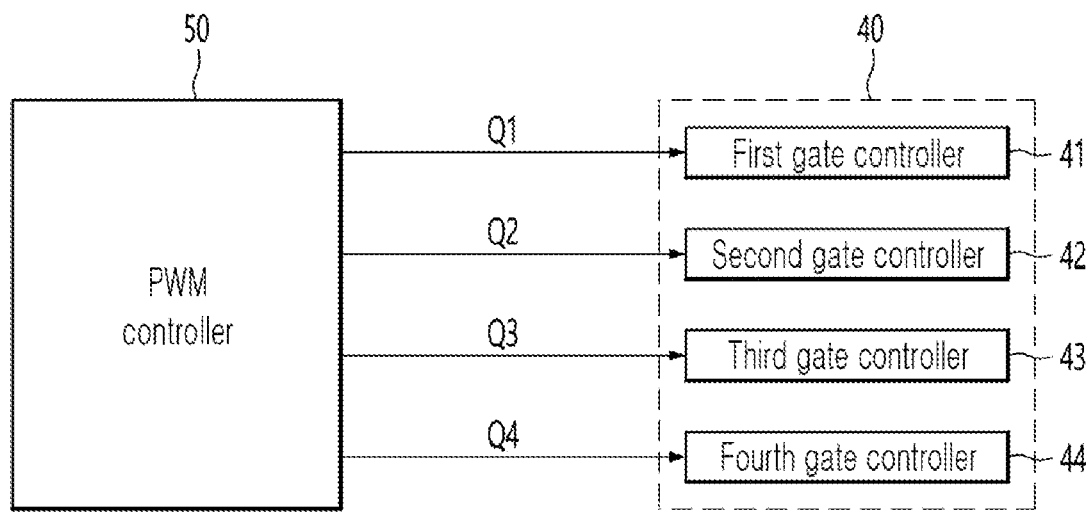
FIG. 2 is a block diagram showing a PWM controller and a gate driver according to one embodiment of the present disclosure.

FIG. 2 is a block diagram illustrating a PWM controller 50 and the gate driver 40 according to one embodiment of the present disclosure.

The power conversion device 1 may include the pulse width modulation (PWM) controller 50.

The pulse width modulation (PWM) controller 50 may perform pulse width modulation on an input voltage and output a pulse width modulation signal.

Further, the pulse width modulation (PWM) controller 50 may output the pulse width modulation signal to the gate driver 40. The gate driver 40 may control each of the switching elements based on the pulse width modulation signal.

For example, the pulse width modulation (PWM) controller 50 may perform the pulse width modulation on the input voltage and may provide each of a plurality of pulse width modulation signals to each of the first gate driver 41, the second gate driver 42, the third gate driver 42, and the fourth gate driver 44.

The pulse width modulation (PWM) controller 50 may output a first pulse width modulation signal $Q_1$ to the first gate driver 41 controlling the first switching element 11. The pulse width modulation (PWM) controller 50 may output a second pulse width modulation signal $Q_2$ to the second gate driver 42 controlling the second switching element 12. The pulse width modulation (PWM) controller 50 may output a third pulse width modulation signal $Q_3$ to the third gate driver 43 controlling the third switching element 13. The pulse width modulation (PWM) controller 50 may output a fourth pulse width modulation signal $Q_4$ to the fourth gate driver 44 that controls the fourth switching element 14.

Each of the gate drivers 41, 42, 43, and 44 may receive each of the pulse width modulation signals $Q_1$, $Q_2$, $Q_3$, and $Q_4$, and may control an on or off state of each of the switching elements 11, 12, 13, and 14, based on each of the pulse width modulation signals $Q_1$, $Q_2$, $Q_3$, and $Q_4$.

Figure 3:
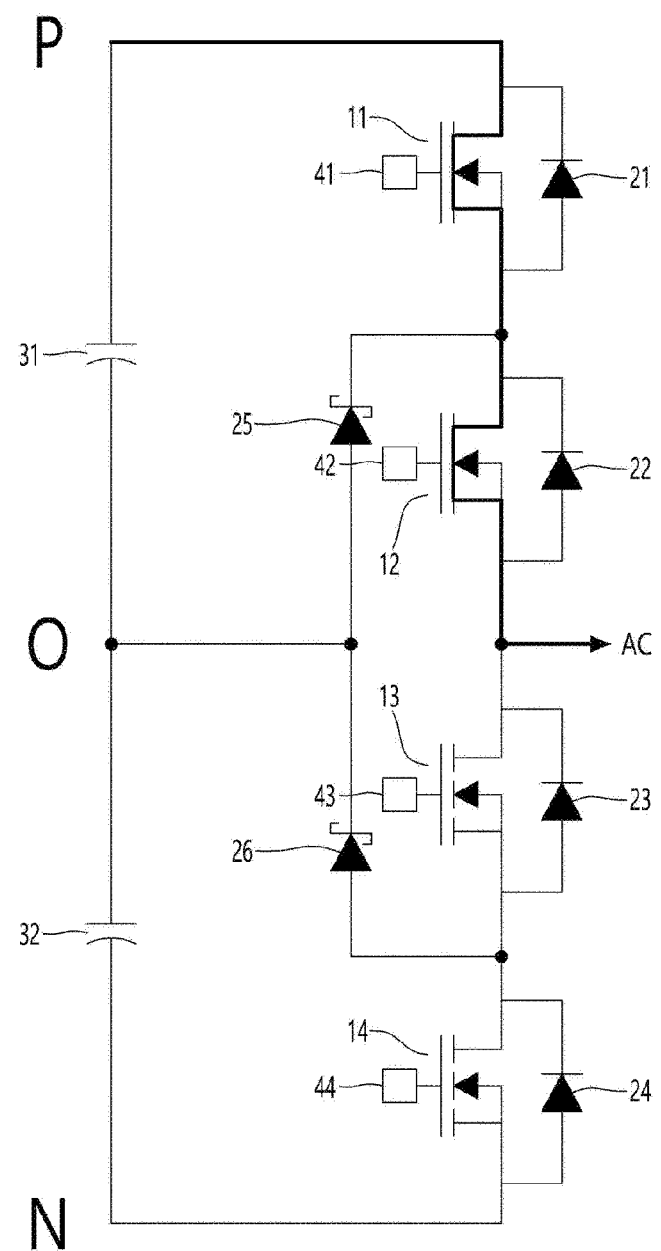
FIG. 3 is a diagram for illustrating a circuit operation of a power conversion device according to one embodiment of the present disclosure.

FIG. 3 is a diagram for illustrating a circuit operation of a power conversion device according to one embodiment of the present disclosure.

Referring to FIG. 3, the gate driver 40 may control the elements so that current flows along a path from the first switching element 11 to the second switching element 12 in the power conversion device 1.

When a DC positive terminal P potential is output, the first gate driver 41 may apply a voltage to the first switching element 11 using the first pulse width modulation signal $Q_1$ received as an input to the first gate driver 41 to turn on the first switching element 11. The second gate driver 42 may apply a voltage to the second switching element 12 using the second pulse width modulation signal $Q_2$ received as an input to the second gate driver 42 to turn on the second switching element 12. The third gate driver 43 may apply a voltage to the third switching element 13 using the third pulse width modulation signal $Q_3$ received as an input to the third gate driver 43 to turn on the third switching element 13. The fourth gate driver 44 may apply a voltage to the fourth switching element 14 using the fourth pulse width modulation signal $Q_4$ received as an input to the fourth gate driver 44 to turn on the fourth switching element 14.

A case in which the P potential is output may mean that the highest potential of the DC power source configured by connecting the first capacitor 31 and the second capacitor 32 in series with each other is output, and may mean a case in which a positive (+) voltage (+E) is output.

Figure 4:
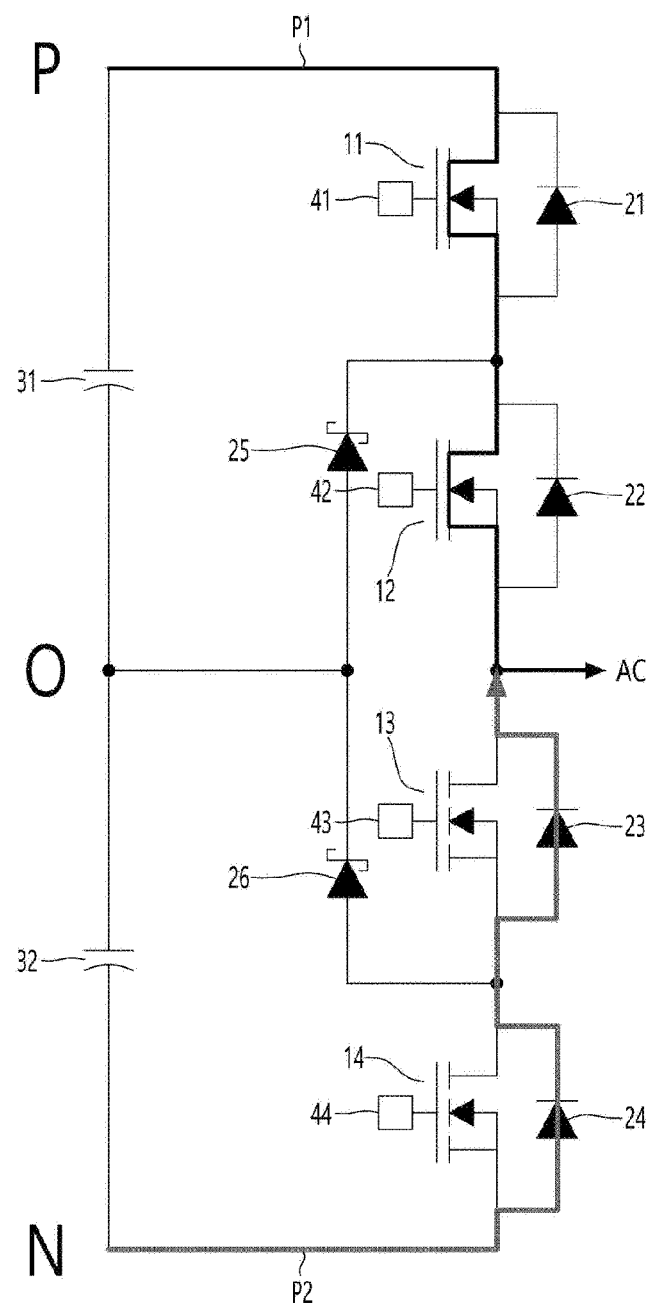
FIG. 4 is a diagram for illustrating current loop generation upon an operation stop of a power conversion device.

FIG. 4 is a diagram for illustrating current loop generation upon stopping of an operation of the power conversion device 1.

Referring to FIG. 4, FIG. 4 shows a case where current flows along a first path P1 from the first switching element 11 to the second switching element 12 in the power conversion device 1.

When the operation of the power conversion device 1 is stopped, the power conversion device 1 may turn off all of the first switching element 11, the second switching element 12, the third switching element 13, and the fourth switching element 14. For example, the pulse width modulation (PWM) controller 50 may output the plurality of pulse width modulation signals $Q_1$, $Q_2$, $Q_3$, and $Q_4$ to the gate driver 40. The first gate driver 41, the second gate driver 42, the third gate driver 43 and the fourth gate driver 44 may be configured to turn off the first switching element 11, the second switching element 12, the third switching element 13 and the fourth switching element 14, respectively, based on the synchronized pulse width modulation signals $Q_1$, $Q_2$, $Q_3$, and $Q_4$.

However, a delay in which a signal is cut may occur. A case may occur in which the first switching element 11, the second switching element 12, the third switching element 13, and the fourth switching element 14 are not turned off at the same time.

For example, when the second switching element 12 is turned off earlier by a predefined time (for example, a few ns), the third switching element 13 and the fourth switching element 14 may be turned on due to the current that has previously flowed along the first path P1. Accordingly, a current loop in which current flows along a second path P2 from the third switching element 13 to the fourth switching element 14 may be generated. In this case, a voltage between a potential of the DC positive terminal P and a potential of the DC negative terminal N may be applied to the second switching element 12, such that the second switching element 12 may be damaged. Therefore, when an operation of the device 1 is stopped, in order to prevent the current loop generation, it is necessary to delay the second pulse width modulation signal $Q_2$ output to the second switching element 12 so that the second switching element 12 is not turned off before the other switching elements are turned off.

Figure 5:
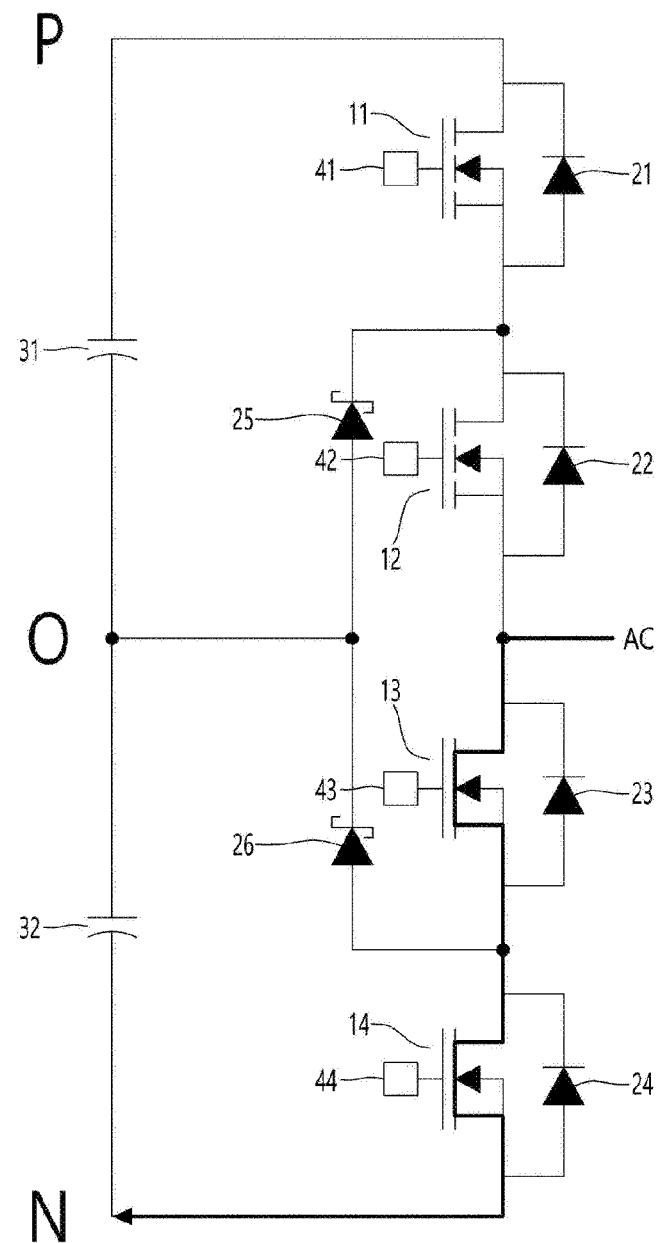
FIG. 5 is a diagram for illustrating a circuit operation of a power conversion device according to one embodiment of the present disclosure.

FIG. 5 is a diagram for illustrating a circuit operation of a power conversion device according to one embodiment of the present disclosure.

Referring to FIG. 5, the gate driver 40 may control the elements such that current can flow along a path from the third switching element 13 to the fourth switching element 14 in the power conversion device 1.

When a DC negative terminal N potential is output, the gate driver 40 may be configured to turn off the first switching element 11 using the first pulse width modulation signal $Q_1$ as received, and turn off the second switching element 12 using the second pulse width modulation signal $Q_2$ as received, and turn on the third switching element 13 using the third pulse width modulation signal $Q_3$ as received, and turn on the fourth switching element 14 using the received fourth pulse width modulation signal $Q_4$.

A case in which the N potential is output may mean that the lowest potential of the DC power source configured by connecting the first capacitor 31 and the second capacitor 32 in series with each other is output, and may mean a case in which a negative (−) voltage (−E) is output.

Figure 6:
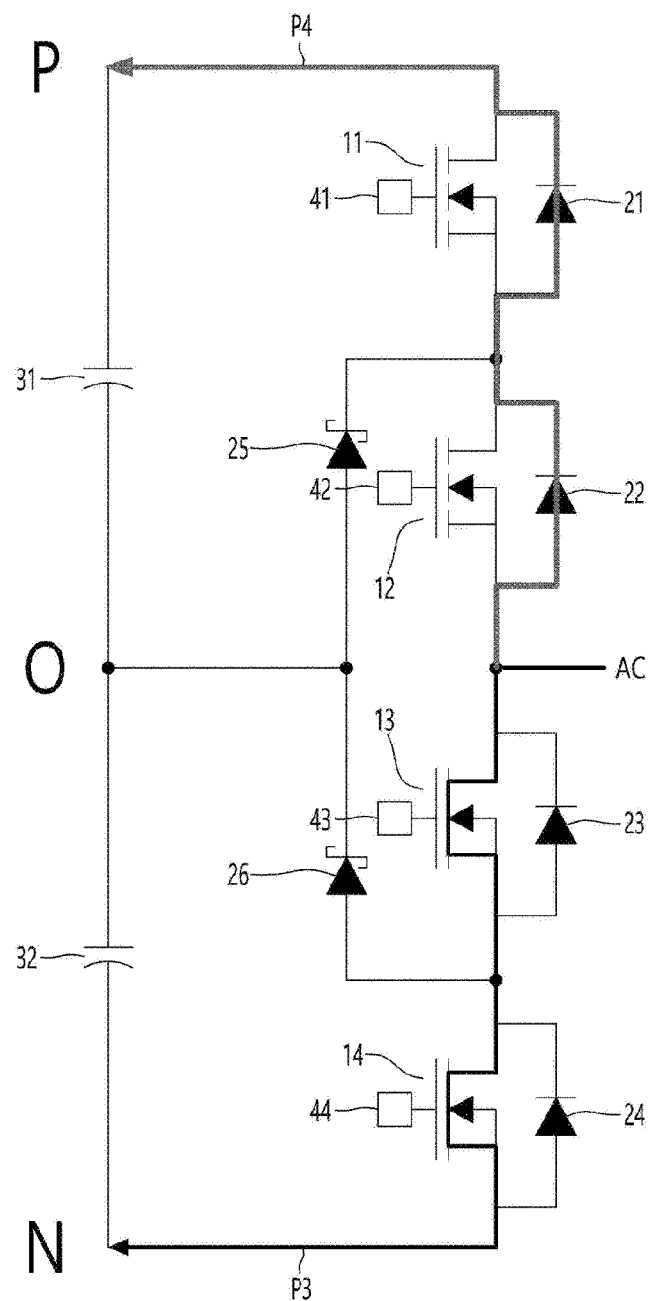
FIG. 6 is a diagram for illustrating the current loop generation upon stopping of an operation of a power conversion device.

FIG. 6 is a diagram for illustrating current loop generation upon stopping of an operation of the power conversion device 1.

Referring to FIG. 6, FIG. 6 shows a case where current flows along a third path P3 from the third switching element 13 to the fourth switching element 14 in the power conversion device 1.

When an operation of the power conversion device 1 is stopped, the device 1 may turn off all of the first switching element 11, the second switching element 12, the third switching element 13, and the fourth switching element 14. For example, the pulse width modulation (PWM) controller 50 may output the plurality of pulse width modulation signals $Q_1$, $Q_2$, $Q_3$, and $Q_4$ to the gate driver 40. The first gate driver 41, the second gate driver 42, the third gate driver 43 and the fourth gate driver 44 may be configured to turn off the first switching element 11, the second switching element 12, the third switching element 13 and the fourth switching element 14, respectively, based on the synchronized pulse width modulation signals $Q_1$, $Q_2$, $Q_3$, and $Q_4$.

However, a delay in which a signal is cut may occur. A case may occur in which the first switching element 11, the second switching element 12, the third switching element 13, and the fourth switching element 14 are not turned off at the same time.

For example, when the third switching element 13 is turned off earlier by a predefined time (for example, a few ns), the first switching element 11 and the second switching element 12 may be turned on due to the current that has previously flowed along the third path P. Accordingly, a current loop in which current flows along a fourth path P4 from the second switching element 12 to the first switching element 11 may be generated. In this case, a voltage between a potential of the DC positive terminal P and a potential of the DC negative terminal N may be applied to the third switching element 13, such that the third switching element 13 may be damaged. Therefore, when an operation of the device 1 is stopped, in order to prevent the current loop generation, it is necessary to delay the second pulse width modulation signal $Q_2$ output to the second switching element 13 so that the second switching element 12 is not turned off before the other switching elements are turned off.

Figure 7:
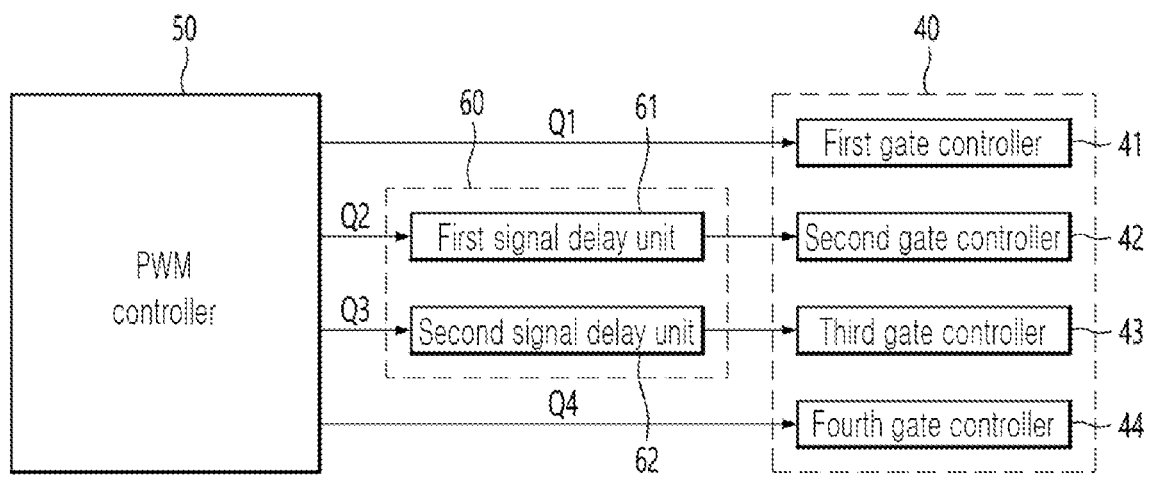
FIG. 7 is a diagram for illustrating a signal delay unit according to one embodiment of the present disclosure.

FIG. 7 is a diagram for illustrating a signal delay unit according to one embodiment of the present disclosure.

The power conversion device 1 may further include a signal delay unit 60.

The signal delay unit 60 may delay a pulse width modulation signal that requires signal delay among the plurality of pulse width modulation signals $Q_1$, $Q_2$, $Q_3$, and $Q_4$ by a predefined delay time.

In this case, the predefined delay time may mean a preset delay time to prevent a predefined switching element from being turned off earlier or to be turned off later.

The first pulse width modulation signal $Q_1$, the second pulse width modulation signal $Q_2$, the third pulse width modulation signal $Q_3$ and the fourth pulse width modulation signal $Q_4$ may be output from the pulse width modulation (PWM) controller 50 and then may be input to the gate driver 40.

When, as described above in FIG. 4 and FIG. 5, the second switching element 12 or the third switching element 13 is turned off earlier by a predefined time (e.g., several ns), the second switching element 12 or the third switching element 13 may be damaged. Thus, the power conversion device 10 may further include the signal delay unit 60 that delays the second pulse width modulation signal $Q_2$ or the third pulse width modulation signal $Q_3$ by the predefined delay time.

For example, a first signal delay unit 61 may delay the second pulse width modulation signal $Q_2$ output from the pulse width modulation (PWM) controller 50 by a predefined delay time such that a delayed second pulse width modulation signal $Q2_d$ is output.

Therefore, when the first pulse width modulation signal $Q_1$, the second pulse width modulation signal $Q_2$, the third pulse width modulation signal $Q_3$ and the fourth pulse width modulation signal $Q_4$ are output from the pulse width modulation (PWM) controller 50 and then are input to the first gate driver 41, the second gate driver 42, the third gate driver 43 and the fourth gate driver 44, respectively, the second gate driver 42 may receive the delayed second pulse width modulation signal $Q2_d$, such that the second gate driver 42 may delay turning off the second switching element 12 by the predefined delay time.

Therefore, even when the operation of the power conversion device 1 is stopped while current flows along the first path P1 from the first switching element 11 to the second switching element 12 in the power conversion device 1, the power conversion device 1 may control the second switching element 12 to be turned off later by the predefined delay time, thereby preventing the generation of the current loop in which current flows along the second path P2 from the fourth switching element 14 to the third switching element 13, and thus preventing the damage to the second switching element 12.

Further, for example, a second signal delay unit 62 may delay the third pulse width modulation signal $Q_3$ output from the pulse width modulation (PWM) controller 50 by a predefined delay time such that a delayed third pulse width modulation signal $Q3_d$ is output.

Therefore, when the first pulse width modulation signal $Q_1$, the second pulse width modulation signal $Q_2$, the third pulse width modulation signal $Q_3$ and the fourth pulse width modulation signal $Q_4$ are output from the pulse width modulation (PWM) controller 50 and then are input to the first gate driver 41, the second gate driver 42, the third gate driver 43 and the fourth gate driver 44, respectively, the third gate driver 43 may receive the delayed third pulse width modulation signal $Q3_d$, such that the third gate driver 43 may delay turning off of the third switching element 13 by the delay time.

Therefore, even when the operation of the power conversion device 1 is stopped while the current flows along the third path P3 from the third switching element 13 to the fourth switching element 13 in the power conversion device 1, the device 1 may control the third switching element 13 to be turned off later by the predefined delay time, thereby preventing the generation of the current loop in which the current flows along the fourth path P4 from the second switching element 12 to the first switching element 11, and thus preventing the damage to the third switching element 13.

In one example, when an operation stop command is executed, the gate driver 40 may be configured such that a timing at which each of the plurality of switching elements is turned off may vary based on an on or off state of each of the plurality of switching elements.

For example, when the first switching element 11 and the second switching element 12 are turned on, and an operation stop command of the power conversion device 1 is executed, the gate driver 40 may turn off the second switching element 12 later by a predefined delay time than a time at which the first switching element 11 is turned off. Accordingly, the second switching element 12 may be prevented from being turned off before the first switching element 11 is turned off, and thus the current loop may not be generated such that the second switching element 12 may be prevented from being damaged.

Further, for example, when the operation stop command of the power conversion device 1 is executed while the third switching element 13 and the fourth switching element 14 are turned on, the gate driver 40 may turn off the third switching element 13 later by a predefined delay time than a time at which the fourth switching element 14 is turned off. Accordingly, the third switching element 13 may be prevented from being turned off before the fourth switching element 14 is turned off, and thus the current loop may not be generated such that the third switching element 13 may be prevented from being damaged.

Figure 8:
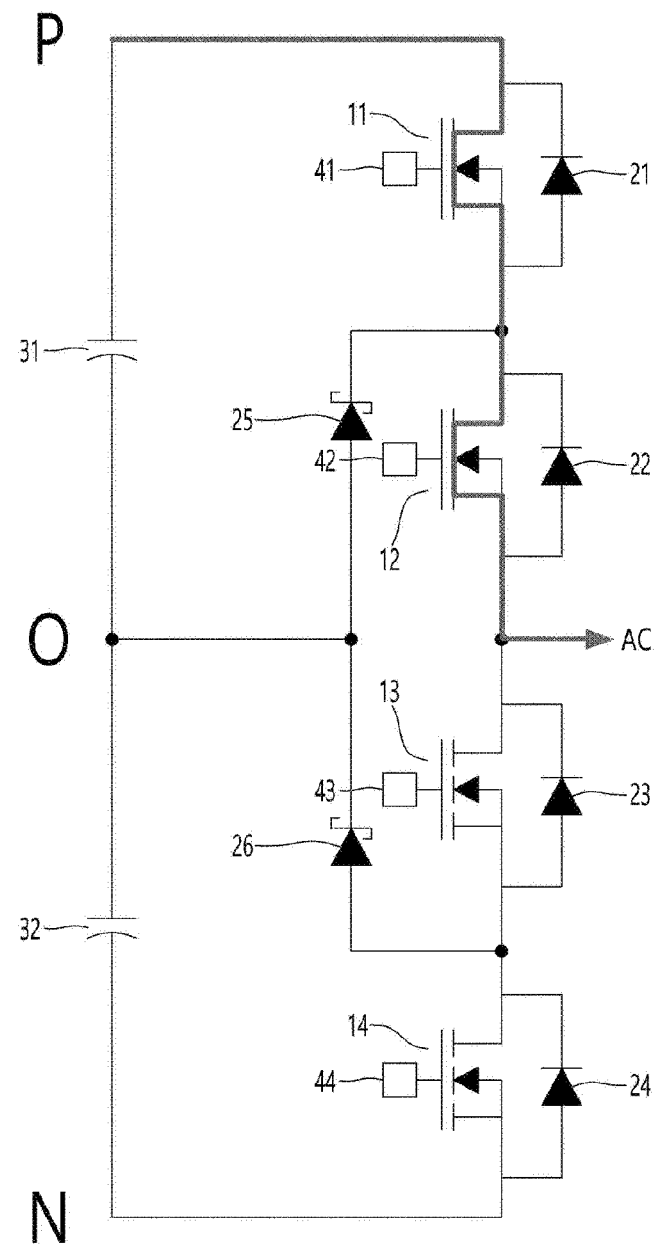
FIG. 8 is a diagram for illustrating a circuit operation of a power conversion device according to another embodiment of the present disclosure.

FIG. 8 is a diagram for illustrating a circuit operation of a power conversion device according to another embodiment of the present disclosure.

When the DC positive terminal P potential is output, the gate driver 40 may be configured to apply a voltage to the first switching element 11 and the second switching element 12 to turn on the first switching element 11 and the second switching element 12 and to turn off the third switching element 13 and the fourth switching element 14. A case in which the P potential is output may mean that the highest potential of the DC power source configured by connecting the first capacitor 31 and the second capacitor 32 in series with each other is output, and may mean a case in which a positive (+) voltage (+E) is output.

Therefore, in the power conversion device 1, current may flow along a path from the first switching element 11 to the second switching element 12.

Figure 9:
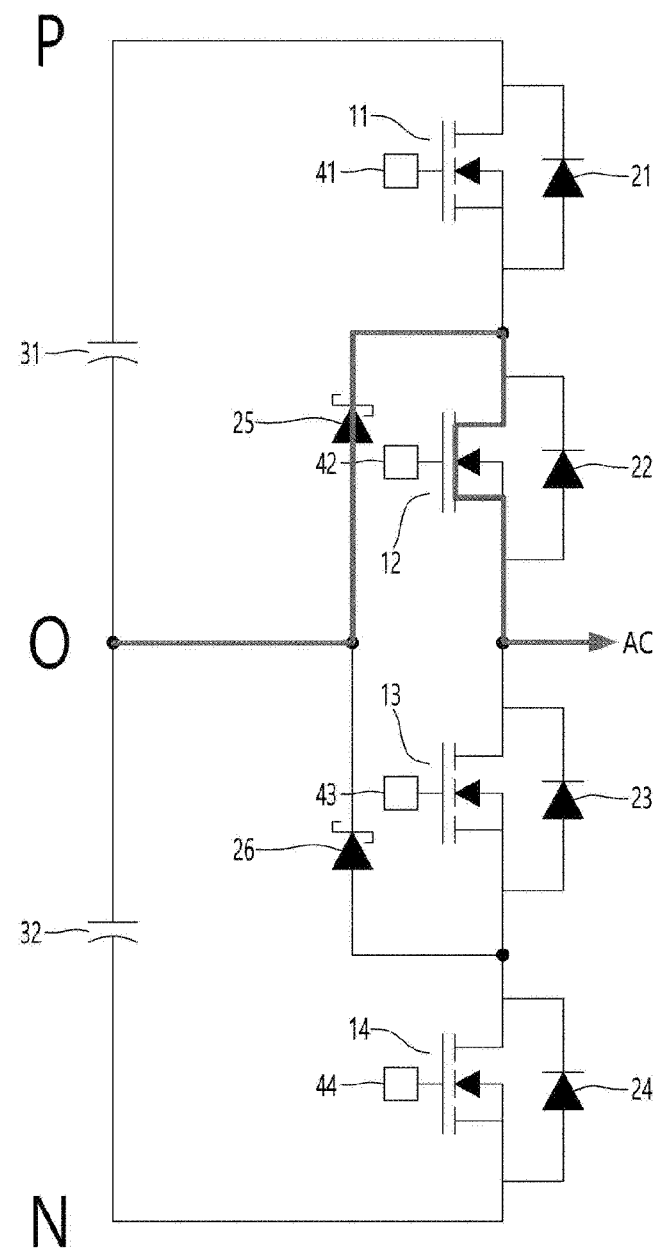
FIG. 9 is a diagram for illustrating a circuit operation of a power conversion device according to another embodiment of the present disclosure.

FIG. 9 is a diagram for illustrating a circuit operation of a power conversion device according to another embodiment of the present disclosure.

When a neutral point O potential is output, and the AC voltage is a positive (+) voltage, the gate driver 40 may be configured to turn off the first switching element 11 and to apply a voltage to the second switching element 12 to turn on the second switching element 12. A case in which the O potential is output may mean that a middle potential of the DC power source configured by connecting the first capacitor 31 and the second capacitor 32 in series with each other is output, and may mean a case in which a 0 voltage is output.

Therefore, in the power conversion device 1, current may flow along a path from the fifth diode 25 to the second switching element 12.

Figure 10:
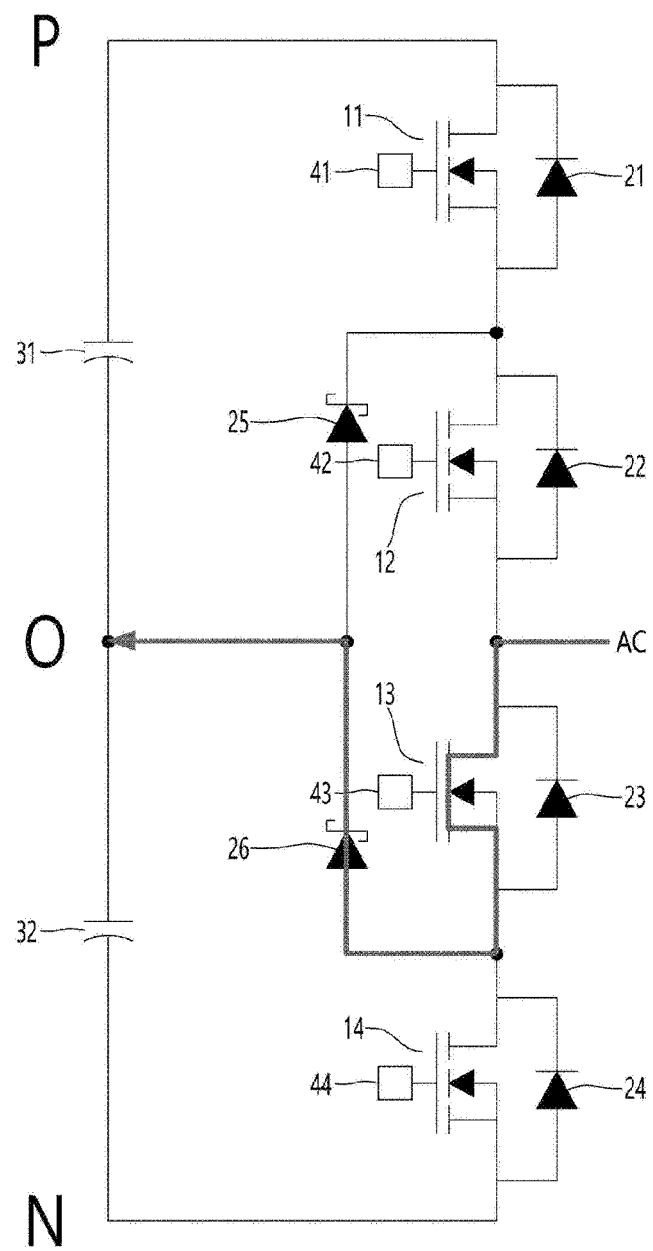
FIG. 10 is a diagram for illustrating a circuit operation of a power conversion device according to another embodiment of the present disclosure.

FIG. 10 is a diagram for illustrating a circuit operation of a power conversion device according to another embodiment of the present disclosure.

When the O potential is output and when the AC voltage is a negative (−) voltage, the gate driver 40 may be configured to turn off the fourth switching element 14 and to apply a voltage to the third switching element 13 to turn on the third switching element 13.

Therefore, in the power conversion device 1, current may flow along a path from the third switching element 13 to the sixth diode 26.

Figure 11:
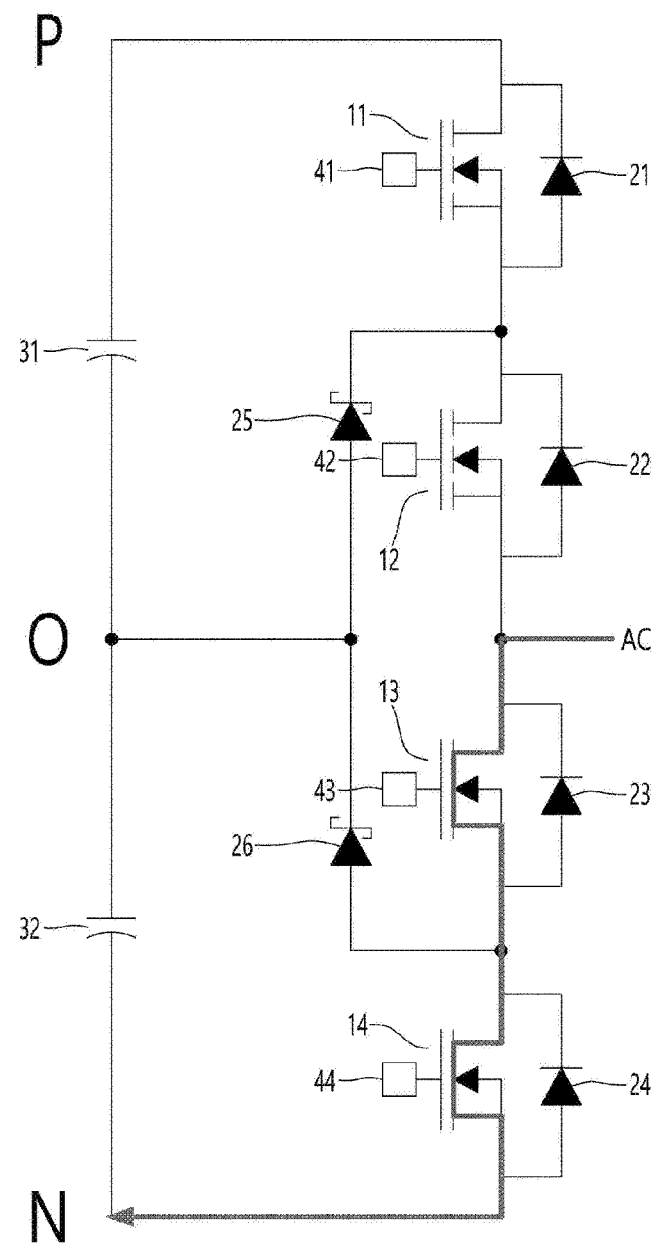
FIG. 11 is a diagram for illustrating a circuit operation of a power conversion device according to another embodiment of the present disclosure.

FIG. 11 is a diagram for illustrating a circuit operation of a power conversion device according to another embodiment of the present disclosure.

When the N potential is output, the gate driver 40 may be configured to apply a voltage to the third switching element 13 and the fourth switching element 14 to turn on the third switching element 13 and the fourth switching element 14 and to turn off the first switching element 11 and the second switching element 12. A case in which the N potential is output may mean that the lowest potential of the DC power source configured by connecting the first capacitor 31 and the second capacitor 32 in series with each other is output, and may mean a case in which a negative (−) voltage (−E) is output.

Therefore, in the power conversion device 1, current may flow along a path from the third switching element 13 to the fourth switching element 14.

In one example, when the second switching element 12 and the third switching element 13 are turned on, the gate driver 40 may be configured not to turn on the first switching element 11.

Further, when the second switching element 12 and the third switching element 13 are turned on, the gate driver 40 may be configured not to turn on the fourth switching element 14.

The gate driver 40 may control the switching elements based on the output potential without considering the direction of the current to reduce the conduction time through the body diode of each of the switching elements.

The above description is merely an illustrative description of the technical idea of the present disclosure, and various modifications and variations may be made to those who have ordinary knowledge in the technical field to which the present disclosure belongs without departing from the essential characteristics of the present disclosure.

Therefore, the embodiments as disclosed in the present disclosure are not intended to limit the technical idea of the present disclosure, but to describe the present disclosure. The scope of the technical idea of the present disclosure is not limited by these embodiments.

The scope of protection of the present disclosure should be interpreted according to the scope of the claims below, and all technical ideas within an equivalent scope thereto should be interpreted as being included in the scope of rights of the present disclosure.

What is claimed is:

1. A power conversion device, comprising:
   a leg including:
      a first switching element, a second switching element, a third switching element, a fourth switching element connected in series with each other;
      a first diode, a second diode, a third diode, and a fourth diode respectively connected in anti-parallel to the first switching element, the second switching element, the third switching element, and the fourth switching element; and
      a fifth diode and a sixth diode connected in series with each other, wherein the fifth diode and the sixth diode are disposed between and respectively connected to a connection point between the first switching element and the second switching element and a connection point between the third switching element and the fourth switching element;
   a smoothing unit including:
      a Direct Current (DC) positive terminal connected to a drain terminal of the first switching element;
      a DC negative terminal connected to a source terminal of the fourth switching element;
      a first capacitor disposed between the DC positive terminal and a neutral point; and
      a second capacitor disposed between the neutral point and the DC negative terminal, wherein the first capacitor and the second capacitor are connected in series;
   an Alternating Current (AC) terminal connected to a connection point between the second switching element and the third switching element;
   a gate driver configured to control an on or off state of each of the first switching element, the second switching element, the third switching element and the fourth switching element, based on voltage outputs from each of the DC positive terminal, the DC negative terminal, and the neutral point;
   a pulse width modulation controller configured to output, to the gate driver:
      a first pulse width modulation signal for controlling the first switching element;
      a second pulse width modulation signal for controlling the second switching element;
      a third pulse width modulation signal for controlling the third switching element; and
      a fourth pulse width modulation signal for controlling the fourth switching element;
   a first signal delay unit provided between the pulse width modulation controller and the gate driver, delaying the second pulse width modulation signal by a predetermined delay time and outputting the delayed second pulse width modulation signal to the gate driver; and
   a second signal delay unit provided between the pulse width modulation controller and the gate driver, delaying the third pulse width modulation signal by the predetermined delay time and outputting the delayed third pulse width modulation signal to the gate driver,
   wherein the pulse width modulation controller outputs the first pulse width modulation signal and the fourth pulse width modulation signal to the gate driver, and outputs the second pulse width modulation signal and the third pulse width modulation signal to the first signal delay unit and the second signal delay unit, and
   wherein, in response to a driving of the power conversion device stopping, the gate driver controls the second switching element to be turned off later than the first switching element for the predetermined delay time, and controls the third switching element to be turned off later than the fourth switching element for the predetermined delay time.

2. The power conversion device of claim 1, wherein when an operation of the power conversion device is stopped while current flows along a path from the first switching element to the second switching element, the gate driver is configured to turn off the second switching element later by the predetermined delay time than a time at which the first switching element is turned off.

3. The power conversion device of claim 1, wherein when an operation of the power conversion device is stopped while current flows along a path from the third switching element to the fourth switching element, the gate driver is configured to turn off the third switching element later by the predetermined delay time than a time at which the fourth switching element is turned off.

4. The power conversion device of claim 1, wherein when the first switching element and the second switching element are turned on and an operation stop command of the power conversion device is executed, the gate driver is configured to turn off the second switching element later by a predefined delay time than a time at which the first switching element is turned off.

5. The power conversion device of claim 1, wherein when the third switching element and the fourth switching element are turned on and an operation stop command of the power conversion device is executed, the gate driver is configured to turn off the third switching element later by the predetermined delay time than a time at which the fourth switching element is turned off.

6. The power conversion device of claim 1, wherein when a voltage from the DC positive terminal is output, the gate driver is configured to turn on the first switching element and the second switching element, and to turn off the third switching element and the fourth switching element.

7. The power conversion device of claim 1, wherein when a voltage from the neutral point is output, and an AC voltage is a positive (+) voltage, the gate driver is configured to turn off the first switching element and to turn on the second switching element.

8. The power conversion device of claim 1, wherein when a voltage from the neutral point is output and an AC voltage is a negative (−) voltage, the gate driver is configured to turn off the fourth switching element and to turn on the third switching element.

9. The power conversion device of claim 1, wherein when a voltage from the DC negative terminal is output, the gate driver is configured to turn on the third switching element and the fourth switching element, and to turn off the first switching element and the second switching element.

10. The power conversion device of claim 1, wherein when the second switching element and the third switching element are in a turned-on state, the gate driver is configured to maintain an off state of the first switching element.

11. The power conversion device of claim 1, wherein when the second switching element and the third switching element are in a turned-on state, the gate driver is configured to maintain an off state of the fourth switching element.

12. The power conversion device of claim 1, wherein the leg is included in a plurality of legs, and the plurality of legs are connected in parallel to each other.

13. The power conversion device of claim 1, wherein a cathode terminal of the fifth diode is connected to and disposed between the first switching element and the second switching element,
   wherein the fifth diode is configured to prevent current flow from the connection point between the first switching element and the second switching element to the neutral point.

14. The power conversion device of claim 13, wherein an anode terminal of the sixth diode is connected to and disposed between the third switching element and the fourth switching element,
   wherein the sixth diode is configured to prevent current flow from the neutral point to the connection point between the third switching element and the fourth switching element.

15. The power conversion device of claim 1, wherein each of the fifth diode and the sixth diode is a Zener diode.

16. The power conversion device of claim 1, wherein the the first switching element, the second switching element, the third switching element, the fourth switching element and the fifth diode and the sixth diode are wide band gap (WBG) semiconductor elements having a band gap equal to or greater than a predefined band gap and are packaged into one module.

* * * * *